(12) United States Patent
Han

(10) Patent No.: US 9,524,884 B2
(45) Date of Patent: Dec. 20, 2016

(54) METHOD OF FABRICATING A SEMICONDUCTOR PACKAGE

(71) Applicant: SAMSUNG ELECTRONICS CO., LTD., Suwon-si, Gyeonggi-do (KR)

(72) Inventor: Cheol-soo Han, Hwaseong-si (KR)

(73) Assignee: SAMSUNG ELECTRONICS CO., LTD., Suwon-Si, Gyeonggi-Do (KR)

(*) Notice: Subject to any disclaimer, the term of this patent is extended or adjusted under 35 U.S.C. 154(b) by 0 days.

(21) Appl. No.: 14/661,569

(22) Filed: Mar. 18, 2015

(65) Prior Publication Data

US 2015/0303075 A1  Oct. 22, 2015

(30) Foreign Application Priority Data

Apr. 18, 2014 (KR) .................. 10-2014-0046931

(51) Int. Cl.

| H01L 23/552 | (2006.01) |
|---|---|
| H01L 21/48 | (2006.01) |
| H01L 21/78 | (2006.01) |
| H01L 23/28 | (2006.01) |
| H01L 21/56 | (2006.01) |
| H01L 23/60 | (2006.01) |
| H01L 23/31 | (2006.01) |
| H01L 23/00 | (2006.01) |

(52) U.S. Cl.

CPC ............ *H01L 21/56* (2013.01); *H01L 21/561* (2013.01); *H01L 21/78* (2013.01); *H01L 23/3121* (2013.01); *H01L 23/3128* (2013.01); *H01L 23/552* (2013.01); *H01L 23/60* (2013.01); *H01L 24/97* (2013.01); *H01L 2224/16145* (2013.01); *H01L 2224/16225* (2013.01); *H01L 2224/32225* (2013.01); *H01L 2224/48091* (2013.01); *H01L 2224/48227* (2013.01); *H01L 2224/73265* (2013.01); *H01L 2924/181* (2013.01)

(58) Field of Classification Search

CPC .......... H01L 23/552; H01L 23/3114–23/3135; H01L 24/95–24/97; H01L 23/561

See application file for complete search history.

(56) References Cited

U.S. PATENT DOCUMENTS

| 5,882,986 A | 3/1999 | Eng et al. |
|---|---|---|
| 6,188,126 B1 | 2/2001 | Pedersen et al. |
| 6,955,947 B2 | 10/2005 | Dias et al. |
| 7,129,576 B2 | 10/2006 | Humpsten |
| 7,606,046 B2 | 10/2009 | Han et al. |

(Continued)

FOREIGN PATENT DOCUMENTS

| KR | 10-0582497 B1 | 5/2006 |
|---|---|---|
| WO | WO 2007/089207 A1 | 8/2007 |

*Primary Examiner* — Marvin Payen
*Assistant Examiner* — Jeremy Joy
(74) *Attorney, Agent, or Firm* — Lee & Morse, P.C.

(57) ABSTRACT

A method of fabricating a semiconductor package includes mounting a plurality of semiconductor devices on a substrate; forming a molding member that covers a top surface of the substrate, top surfaces of the semiconductor devices, and sidewall surfaces of the semiconductor devices; sawing the molding member and the substrate along pre-scribing lines of the substrate; and spraying a metallic epoxy material on the sawn molding members using a sprayer to form an antistatic layer on sidewall surfaces and a top surface of each of the sawn molding members.

12 Claims, 11 Drawing Sheets

(56) References Cited

U.S. PATENT DOCUMENTS

| | | | |
|---|---|---|---|
| 7,656,047 B2* | 2/2010 | Yang | H01L 23/29 257/787 |
| 7,989,928 B2* | 8/2011 | Liao | H01L 21/568 257/659 |
| 8,324,103 B2 | 12/2012 | Bauer | |
| 8,338,234 B2* | 12/2012 | Iimura | H01L 21/481 257/673 |
| 8,410,584 B2* | 4/2013 | An | H01L 23/3121 257/659 |
| 9,070,793 B2* | 6/2015 | Liao | H01L 23/3121 |
| 2004/0187975 A1 | 9/2004 | Suemasu et al. | |
| 2005/0040498 A1* | 2/2005 | Dias | H01L 21/6836 257/620 |
| 2005/0221585 A1 | 10/2005 | Perregaux et al. | |
| 2008/0233714 A1 | 9/2008 | Kojima | |
| 2009/0194852 A1* | 8/2009 | Chiu | H01L 21/568 257/660 |
| 2009/0294928 A1* | 12/2009 | Kim | H01L 21/561 257/659 |
| 2009/0302435 A1* | 12/2009 | Pagaila | H01L 21/561 257/659 |
| 2010/0172116 A1* | 7/2010 | Yorita | H01L 21/565 361/816 |
| 2010/0320577 A1* | 12/2010 | Pagaila | H01L 21/565 257/659 |
| 2011/0006408 A1* | 1/2011 | Liao | H01L 21/561 257/660 |
| 2012/0015687 A1* | 1/2012 | Yamada | H01L 23/3128 455/550.1 |
| 2012/0098109 A1* | 4/2012 | Ko | H01L 21/561 257/659 |
| 2014/0070395 A1* | 3/2014 | Chen | H01L 23/552 257/698 |

* cited by examiner

METHOD OF FABRICATING A SEMICONDUCTOR PACKAGE

CROSS-REFERENCE TO RELATED APPLICATION

Korean Patent Application No. 10-2014-0046931, filed on Apr. 18, 2014, in the Korean Intellectual Property Office, and entitled: "Method Of Fabricating Semiconductor Package," is incorporated by reference herein in its entirety.

BACKGROUND

1. Field

Provided is a method of fabricating a semiconductor package, for example, to a method of fabricating a semiconductor package including a semiconductor chip.

2. Description of the Related Art

Small, high capacity, and multi-functional semiconductor products, which are capable of processing large amounts of data, are increasingly in demand with the development of electronic systems. Highly integrated semiconductor chips and a single package including various semiconductor chips have been continuously developed. Shrinkage of the semiconductor products may lead to the development of chip scale package (CSP) technologies, and package technologies which may be capable of improving the mechanical and electrical reliability of the semiconductor chips mounted on a package substrate may become more important. For example, in the semiconductor package technologies, an electrostatic discharge (ESD) function may be required.

SUMMARY

Embodiments may be realized by providing a method of fabricating a semiconductor package, the method including mounting a plurality of semiconductor devices on a substrate; forming a molding member that covers a top surface of the substrate, top surfaces of the semiconductor devices, and sidewall surfaces of the semiconductor devices; sawing the molding member and the substrate along pre-scribing lines of the substrate; and spraying a metallic epoxy material on the sawn molding members using a sprayer to form an antistatic layer on sidewall surfaces and a top surface of each of the sawn molding members.

Forming the antistatic layer may include simultaneously covering the top surface and the sidewall surfaces of each of the sawn molding members by spraying the metallic epoxy material on each of the sawn molding members only once using the sprayer.

The metallic epoxy material may be uniformly sprayed onto the sawn molding member to form the antistatic layer having a uniform thickness.

The metallic epoxy material may include a metallic material that shields the semiconductor devices from static electricity and electromagnetic wave signals.

Sawing the molding member and the substrate may include using a "V"-shaped cutting blade such that a planar area of a bottom surface of each of the sawn molding members is greater than a planar area of a top surface of each of the sawn molding members and each of the sidewall surfaces of each of the sawn molding member has a sloped profile.

The method may further include forming ground patterns on the substrate in regions between the plurality of semiconductor devices before forming the molding member.

Sawing the molding member and the substrate may include sawing the ground patterns to form sawn ground patterns; and sawing the ground patterns may expose a sidewall surface of the sawn ground patterns.

A sidewall surface of the sawn ground patterns exposed by sawing the ground patterns may contact the antistatic layer.

Embodiments may be realized by providing a method of fabricating a semiconductor package, the method including providing a substrate; mounting a plurality of first semiconductor devices on the substrate; stacking a plurality of second semiconductor devices on the plurality of first semiconductor devices; forming a molding member that covers a top surface of the substrate, sidewall surfaces of the plurality of first semiconductor devices, and top surfaces and sidewall surfaces of plurality of second semiconductor devices; sawing the molding member and the substrate using a "V"-shaped cutter such that a planar area of a bottom surface of each of the sawn molding members is greater than a planar area of a top surface of each of the sawn molding members, a planar area of a bottom surface of each of the sawn substrates is greater than a planar area of a top surface of each of the sawn substrates, and sidewall surfaces of the sawn molding members and the sawn substrates have a sloped profile; and forming an antistatic layer that covers sidewall surfaces and a top surface of each of the sawn molding members and sidewalls of each of the sawn substrates.

Forming the antistatic layer may include spraying an antistatic material on the sidewalls surfaces and the top surface of each of the sawn molding member using a sprayer.

Mounting the plurality of first semiconductor devices on the substrate may include forming first through electrodes penetrating the plurality of first semiconductor devices; and mounting the plurality of first semiconductor devices on the substrate to electrically connect the plurality of first semiconductor devices to the substrate via the first through electrodes.

Stacking the plurality of second semiconductor devices may include forming second through electrodes penetrating the plurality of second semiconductor devices; and stacking the plurality of second semiconductor devices on the plurality of first semiconductor devices to electrically connect the second through electrodes to the first through electrodes.

The method may further include forming a plurality of ground patterns on the substrate between the plurality of first semiconductor devices.

The plurality of ground patterns may be formed of a conductive metal material.

Sawing the molding member and the substrate may include sawing the plurality of ground patterns to expose a sidewall surface of each of the sawn ground patterns.

Embodiments may be realized by providing a method of fabricating a semiconductor package, the method including mounting a plurality of semiconductor devices on a substrate; forming a molding member that covers a top surface of the substrate, top surfaces of the semiconductor devices, and sidewall surfaces of the semiconductor devices; dividing the semiconductor devices to form individual semiconductor devices such that a planar area of a bottom surface of each of individual semiconductor devices is greater than a planar area of a top surface of each of individual semiconductor devices; and forming an antistatic layer that covers sidewall surfaces and a top surface of each of the individual semiconductor devices.

Sidewall surfaces of the individual semiconductor devices may have a sloped profile.

Sidewall surfaces of the individual semiconductor devices may be convex or concave.

Dividing the semiconductor devices may include cutting the substrate into individual substrates corresponding to the individual semiconductor devices; and a planar area of a bottom surface of each of the individual substrates may be greater than a planar area of a top surface of each of the individual substrates.

The antistatic layer may cover sidewalls of the individual substrates.

BRIEF DESCRIPTION OF THE DRAWINGS

Features will become apparent to those of skill in the art by describing in detail exemplary embodiments with reference to the attached drawings in which.

DETAILED DESCRIPTION

Figure 1:
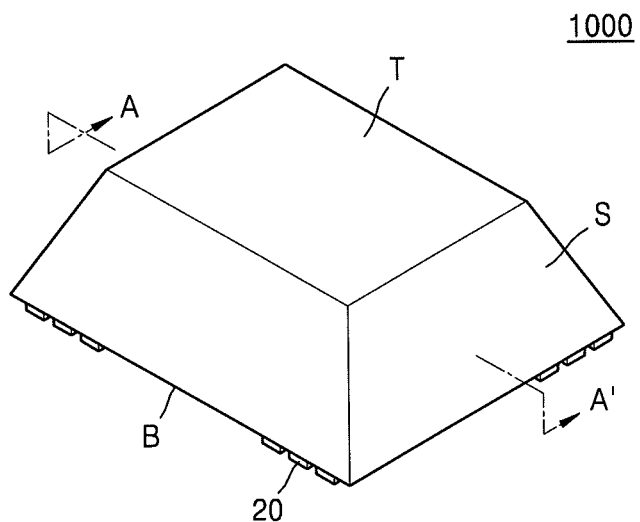
FIG. 1 illustrates a perspective view of a semiconductor package according to an embodiment.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

It will be understood that when an element or layer is referred to as being "on," "connected to," and/or "coupled to" another element or layer, the element or layer may be directly on, connected and/or coupled to the other element or layer, or intervening elements or layers may be present. In contrast, when an element is referred to as being "directly on," "directly connected to," and/or "directly coupled to" another element or layer, no intervening elements or layers are present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present.

The same reference numerals or the same reference designators denote the same elements throughout the specification. As used herein, the term "and/or" includes any and all combinations of one or more of the associated listed items.

It will be also understood that although the terms first, second, third, etc., may be used herein to describe various elements, these elements should not be limited by these terms. These terms are only used to distinguish one element from another element. Thus, a first element in some embodiments could be termed a second element in other embodiments.

Spatially relative terms, such as "beneath," "below," "lower," "above," "upper," and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of exemplary embodiments. As used herein, the singular forms "a," "an" and "the" are intended to include the plural forms as well, unless the context clearly indicates otherwise. It will be further understood that the terms "comprises", "comprising", "includes" and/or "including," if used herein, specify the presence of stated features, integers, steps, operations, elements and/or components, but do not preclude the presence or addition of one or more other features, integers, steps, operations, elements, components and/or groups thereof.

Exemplary embodiments are described herein with reference to various drawings that are schematic illustrations of idealized embodiments (and intermediate structures) of exemplary embodiments. As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing.

Expressions such as "at least one of," when preceding a list of elements, modify the entire list of elements and do not modify the individual elements of the list.

Although corresponding plan views and/or perspective views of some cross-sectional view(s) may not be shown, the cross-sectional view(s) of device structures illustrated herein provide support for a plurality of device structures that extend along two different directions as would be illustrated in a plan view, and/or in three different directions as would be illustrated in a perspective view. The two different directions may or may not be orthogonal to each other. The three different directions may include a third direction that may be orthogonal to the two different directions. The plurality of device structures may be integrated in a same electronic device. For example, when a device structure (e.g., a memory cell structure) is illustrated in a cross-sectional view, an electronic device may include a plurality of the device structures (e.g., memory cell structures), as would be illustrated by a plan view of the electronic device. The plurality of device structures may be arranged in an array and/or in a two-dimensional pattern.

FIG. 1 illustrates a perspective view of a semiconductor package 1000 according to an embodiment. Referring to FIG. 1, the semiconductor package 1000 may have a three-dimensional (3D) structure that includes a top surface T and a bottom surface B having a rectangular shape and sidewall surfaces S having a trapezoidal shape. Each of the top surface T and the bottom surface B of the semiconductor package 1000 may have a tetragonal shape such as, for example, a rectangular shape or a square shape. A planar area of the top surface T may be less than a planar area of the bottom surface B. Each sidewall surface S may have a side contacting a side of the top surface T and another side contacting a side of the bottom surface B, and each of the sidewall surfaces S may have a sloped profile. An antistatic layer (500 of FIG. 2) may be disposed on the top surface T and the sidewall surfaces S of the semiconductor package 1000. The semiconductor package 1000 may include a first semiconductor chip (110 of FIG. 2), a second semiconductor chip (210 of FIG. 4), or both the first and second semiconductor chips 110 and 210. A detailed description of the first and/or second semiconductor chips 110 and 210 included in the semiconductor package 1000 will be described with reference to FIGS. 2 and 4.

Figure 2:
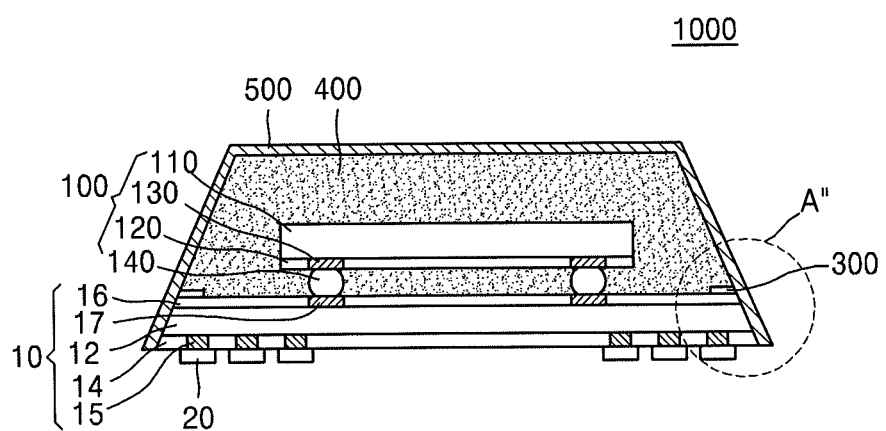
FIG. 2 illustrates a cross-sectional view taken along a line A-A' of FIG. 1.

FIG. 2 illustrates a cross-sectional view taken along a line A-A' of FIG. 1. Referring to FIG. 2, the semiconductor package 1000 may include a substrate 10, external connection terminals 20 disposed on a bottom surface of the substrate 10, a first semiconductor device 100 mounted on a top surface of the substrate 10, ground patterns 300 disposed on edges of the top surface of the substrate 10, a molding member 400 disposed on the top surface of the substrate 10 to cover the first semiconductor device 100, and an antistatic layer 500 covering a top surface and sidewall surfaces of the molding member 400 and extending to contact sidewall surfaces of the substrate 10.

The substrate 10 may be a support substrate on which the first semiconductor device 100 is mounted and may include a body layer 12, a lower protection layer 14, lower pads 15, an upper protection layer 16, and upper pads 17. The substrate 10 may include at least one of a ceramic substrate, a printed circuit board (PCB), an organic substrate, an interposer substrate and a package substrate. In an embodiment, the substrate 10 may be an active wafer.

Interconnection patterns formed of a single-layered material or a multi-layered material may be disposed in the body layer 12, and the interconnection patterns may electrically and/or physically connect the lower pads 15 to the upper pads 17. The lower protection layer 14 and the upper protection layer 16 may protect the body layer 12 and may include an insulation material. For example, each of the lower protection layer 14 and the upper protection layer 16 may include a solder resist material.

The lower pads 15 may be disposed on a bottom surface of the body layer 12 and may penetrate the lower protection layer 14 to be electrically and/or physically connected to the interconnection patterns in the body layer 12. The lower pads 15 may include a conductive material. Under bump metal (UBM) patterns may be disposed on the lower pads 15. In an exemplary embodiment, the lower pads 15 may be formed of an aluminum material or a copper material using a pulse plating process or a direct current (DC) plating process.

The upper pads 17 may be disposed on a top surface of the body layer 12 and may penetrate the upper protection layer 16 to be electrically and/or physically connected to the interconnection patterns in the body layer 12. A formation method of the upper pads 17 may be the same as the formation method of the lower pads 15.

An area of a top surface of the substrate 10 may be less than an area of a bottom surface of the substrate 10, and each of sidewall surfaces of the substrate 10 may have a sloped profile. A planar area of the upper protection layer 16 may be less than a planar area of the body layer 12, and the planar area of the body layer 12 may be less than a planar area of the lower protection layer 14. Each of the sidewall surfaces of the body layer 12, the lower protection layer 14 and the upper protection layer 16 may have a sloped profile. The sloped sidewall surfaces of the substrate 10 may contact an inner surface of the antistatic layer 500.

The external connection terminals 20 may contact the lower pads 15. The external connection terminals 20 may be electrically and/or physically connected to the lower pads 15. The external connection terminals 20 may be disposed on a bottom surface of the substrate 10 to electrically connect the semiconductor package 1000 to an external system substrate or a main board when the semiconductor package 1000 is mounted on the external system substrate or the main board. The external connection terminals 20 may be formed of a conductive material. For example, the external connection terminals 20 may be formed of at least one of a copper (Cu) material, an aluminum (Al) material, a silver (Ag) material, a tin (Sn) material, a gold (Au) material and a solder material. The external connection terminals 20 may be formed of a single-layered material or a multi-layered material.

The first semiconductor device 100 may include a first semiconductor chip 110, a passivation layer 120, lower interconnection patterns 130, and connection members 140. The first semiconductor device 100 may be formed using an active wafer or an interposer substrate. The active wafer means a wafer, for example, a silicon wafer on which a plurality of semiconductor chips are formed.

The first semiconductor chip 110 may include a Group IV material wafer such as a silicon wafer or a Group III-V compound wafer. The first semiconductor chip 110 may be formed, for example, using a single crystalline wafer such as a single crystalline silicon wafer. In some embodiments, the first semiconductor chip 110 may be formed using an epitaxial wafer, a polished wafer, an annealed wafer or a silicon-on-insulator (SOI) wafer as a semiconductor wafer. The epitaxial wafer may correspond to a wafer which is formed by growing a crystalline material on a single crystalline silicon substrate.

In some embodiments, the first semiconductor chip 110 may be a logic semiconductor chip. For example, the first semiconductor chip 110 may be a microprocessor chip or an application specific integrated circuit (ASIC) chip. The microprocessor chip may include a central processing unit (CPU) chip. In some embodiments, the first semiconductor chip 110 may be an application processor (AP) employed in mobile phones or smart phones.

The lower interconnection patterns 130 disposed on a bottom surface of the first semiconductor chip 110 may electrically connect the first semiconductor chip 110 to the connection members 140. The first semiconductor chip 110 may be electrically connected to the substrate 10 through the lower interconnection patterns 130 and the connection members 140. The lower interconnection patterns 130 may be formed in the passivation layer 120 such that the lower interconnection patterns 130 are connected to the connection members 140. The material and formation method of the lower interconnection patterns 130 may be the same as the material and formation method of the lower pads 15. The material and formation method of the lower interconnection patterns 130 will be omitted hereinafter to avoid duplicate explanations.

Ground patterns 300 may be disposed on both edges of a top surface of the substrate 10. The number of the ground patterns 300 may be, for example, two as illustrated in FIG. 2. In an embodiment, one, three or more ground patterns 300 may be disposed on one edge of the top surface of the substrate 10. The ground patterns 300 may be formed of a conductive metal material, for example, a copper (Cu) material, an aluminium (Al) material or a zinc (Zn) material. A top surface and an inner sidewall surface of each of the ground patterns 300 may be covered with the molding member 400, and an outer sidewall surface of each of the ground patterns 300 may be covered with and connected to the antistatic layer 500. A detailed description of the ground patterns 300 and the antistatic layer 500 will be given with reference to FIG. 3.

Referring again to FIG. 2, the molding member 400 may be formed to cover a top surface of the substrate 10, a top surface and sidewall surfaces of the first semiconductor chip 110, and top surfaces and inner sidewall surfaces of the ground patterns 300. The molding member 400 may be formed to encapsulate the first semiconductor device 100, and the first semiconductor device 100 may be protected by the molding member 400. The molding member 400 may include an insulation material. The molding member 400 may be formed using a molded underfill (MUF) technique.

A planar area of a bottom surface of the molding member 400 may be greater than a planar area of a top surface of the molding member 400, and sidewall surfaces of the molding member 400 may have a sloped profile. This shape of the molding member 400 may be due to a cutting process (i.e., a die sawing process) that is performed using a "V"-shaped blade wheel (610 of FIGS. 10 and 11) to separate a plurality of semiconductor packages 1000 formed on a wafer. A detailed description of the cutting process will be given with reference to FIGS. 10, 11, and 12.

Referring again to FIG. 2, the antistatic layer 500 may be formed to surround a top surface and sidewall surfaces of the molding member 400 and sidewall surfaces of the substrate 10. The antistatic layer 500 may be formed of a metallic epoxy material that includes a metallic material having an electrostatic discharge (ESD) function and an epoxy resin material. In some embodiments, the antistatic layer 500 may be formed of a mixture of a copper material and an epoxy resin material. In an embodiment, the antistatic layer 500 may be formed of a mixture of an alloy of copper and nickel and an epoxy resin material. The antistatic layer 500 may prevent the first semiconductor device 100 from being damaged or malfunctioning, for example, due to external static electricity.

Lower inner surfaces of the antistatic layer 500 may contact the sidewall surfaces of the substrate 10 and outer sidewall surfaces of the ground patterns 300. The antistatic layer 500 may contact the outer sidewall surfaces of the ground patterns 300 formed of a conductive metal material to ground external electromagnetic wave signals, and the antistatic layer 500 may shield internal circuits of the first semiconductor device 100 to suppress an electromagnetic interference (EMI) phenomenon. The antistatic layer 500 may prevent malfunctioning of the first semiconductor device 100 or the semiconductor package 1000, and reliability of the semiconductor package 1000 may be improved. The antistatic layer 500 may shield the internal circuits of the first semiconductor device 100 to prevent electromagnetic wave signals generated in the first semiconductor device 100 from propagating out of the semiconductor package 1000. The antistatic layer 500 may be present, electromagnetic wave signals corresponding to noise may be generated in the first semiconductor device 100, and other semiconductor devices or other semiconductor packages adjacent to the semiconductor package 1000 may operate normally.

In some embodiments, the antistatic layer 500 may be formed of a material having a high heat conductivity to act as a heat radiation member. For example, the antistatic layer 500 may be formed to include at least one of a silver (Ag) material, an aluminum (Al) material, a copper (Cu) material, a platinum (Pt) material, a zinc (Zn) material, a nickel (Ni) material, and an iron (Fe) material.

According to embodiments described above, the semiconductor package 1000 may be provided to include the molding member 400 having a top surface, a bottom surface having a planar area greater than a planar area of the top surface, and sidewall surfaces having a sloped profile, and to include the antistatic layer 500 disposed on the molding member 400 to block external electromagnetic wave signals. A process for forming the antistatic layer 500 may be simplified (refer to a description of FIG. 14). The antistatic layer 500 may contact the ground patterns 300 to block external electromagnetic wave signals and to prevent internal electromagnetic wave signals generated in the first semiconductor device 100 from being propagated out of the semiconductor package 1000.

Figure 3:
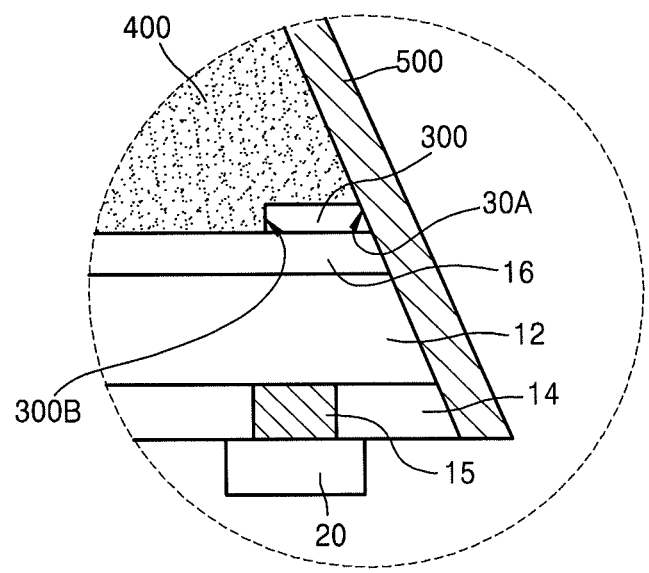
FIG. 3 illustrates an enlarged view of a portion of FIG. 2.

FIG. 3 illustrates an enlarged view of a portion A" of FIG. 2. Referring to FIG. 3, the ground pattern 300 may be disposed on an edge of a top surface of the upper protection layer 16. The antistatic layer 500 may be disposed to cover sidewall surfaces of the body layer 12, the lower protection layer 14 and the upper protection layer 16, a first sidewall surface 300A (i.e., an outer sidewall surface) of the ground pattern 300, and a sidewall surface of the molding member 400. The molding member 400 may be disposed to cover a top surface and a second sidewall surface 300B (i.e., an inner sidewall surface) of the ground pattern 300.

As described with reference to FIG. 2, the lower inner sidewall surface of the antistatic layer 500 may contact the first sidewall surface 300A of the ground pattern 300, and the antistatic layer 500 may be grounded to shield the first semiconductor device 100 and to block the external electromagnetic wave signals. In some embodiments, whereas the ground patterns 300 are formed of a conductive material, the upper protection layer 16 and the lower protection layer 14 may be formed of an insulation material. The antistatic layer 500 may extend to cover the sidewall surfaces of the substrate 10, and the interconnection patterns in the body layer 12 may not be influenced by external electromagnetic wave signals.

Figure 4:
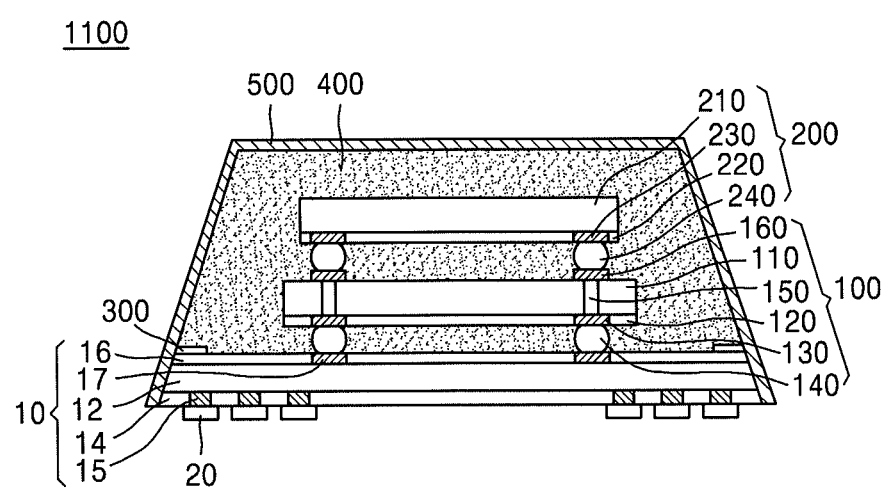
FIGS. 4, 5, 6, 7, and 8 illustrate cross-sectional views of semiconductor packages according to some embodiments.

FIG. 4 illustrates a cross-sectional view of a semiconductor package 1100 according to an embodiment. Referring to FIG. 4, the semiconductor package 1100 may include a substrate 10, external connection terminals 20 disposed on a bottom surface of the substrate 10, a first semiconductor device 100 mounted on a top surface of the substrate 10, a second semiconductor device 200 stacked on a top surface of the first semiconductor device 100 opposite to the substrate 10, ground patterns 300 disposed on edges of the top surface of the substrate 10, a molding member 400 disposed on the top surface of the substrate 10 to cover the first and second semiconductor devices 100 and 200, and an antistatic layer 500 covering a top surface and sidewall surfaces of the molding member 400 and extending to contact sidewall surfaces of the substrate 10. As compared with the semiconductor package 1000 illustrated in FIG. 2, the semiconductor package 1100 may further include the second semiconductor device 200 and first through electrodes 150 penetrating the first semiconductor device 100. The substrate 10, the external connection terminals 20, the ground patterns 300, the molding member 400, and the antistatic layer 500 may have the same configurations as described with reference to FIG. 2. Descriptions of the substrate 10, the external connection terminals 20, the ground patterns 300, the molding member 400, and the antistatic layer 500 will be omitted in the present embodiment to avoid duplicate explanations.

The first through electrodes 150 may penetrate the first semiconductor chip 110 from a top surface of the first semiconductor chip 110 toward a bottom surface of the semiconductor chip 110. In some embodiments, the first through electrodes 150 may be through silicon vias (TSVs). The TSVs may be formed to include at least one of an aluminum (Al) material, a gold (Au) material, a beryllium (Be) material, a bismuth (Bi) material, a cobalt (Co) material, a copper (Cu) material, a hafnium (Hf) material, an indium (In) material, a manganese (Mn) material, a molybdenum (Mo) material, a nickel (Ni) material, a lead (Pb) material, a palladium (Pd) material, a platinum (Pt) material, a rhodium (Rh) material, a rhenium (Re) material, a ruthenium (Ru) material, a tantalum (Ta) material, a tellurium (Te) material, a titanium (Ti) material, a tungsten (W) material, a zinc (Zn) material, and a zirconium (Zr) material. The first through electrodes 150 may be electrically and/or physically connected to the lower interconnection patterns 130, and the lower interconnection patterns 130 may be electrically and/or physically connected to the upper pads 17 through the connection members 140. The first semiconductor chip 110 may be electrically and/or physically connected to the substrate 10.

Upper pads 160 may be disposed on a top surface of the first semiconductor chip 110 and may be connected to the first through electrodes 150. The upper pads 160 may be electrically and/or physically connected to the second semiconductor device 200 through connection members 240. The upper pads 160 may be connected to the first through electrodes 150, and the upper pads 160 may electrically connect the first semiconductor device 100 to the second semiconductor device 200.

The second semiconductor device 200 may include a second semiconductor chip 210, a passivation layer 220, lower pads 230, and the connection members 240

The second semiconductor chip 210 may be formed using an active wafer or an interposer substrate. A material, a shape and a formation method of the second semiconductor chip 210 may be identical to a material, a shape and a formation method of the first semiconductor chip 110 described above. Descriptions of the material, the shape and the formation method of the second semiconductor chip 210 will be omitted in the present embodiment to avoid duplicate explanations. A dimension or a size of the second semiconductor chip 210 may be different from a dimension or a size of the first semiconductor chip 110. In some embodiments, a planar area of the second semiconductor chip 210 may be less than a planar area of the first semiconductor chip 110.

The first and second semiconductor chips 110 and 210 may be different from each other in terms of their function. In some embodiments, the first semiconductor chip 110 may be a logic semiconductor chip and the second semiconductor chip 210 may be a memory semiconductor chip. For example, the second semiconductor chip 210 may include at least one selected from a dynamic random access memory (DRAM) chip, a static random access memory (SRAM) chip, a flash memory chip, an electrically erasable programmable read only memory (EEPROM) chip, a phase change random access memory (PRAM) chip, a magnetic random access memory (MRAM) chip, and a resistive random access memory (RRAM) chip. In some embodiments, the second semiconductor chip 210 may be the same type semiconductor chip as the first semiconductor chip 110.

The passivation layer 220 may be disposed on a bottom surface of the second semiconductor chip 210 to protect the second semiconductor chip 210. The passivation layer 220 may be formed to include an oxide layer, a nitride layer, or a combination thereof. For example, the passivation layer 220 may be formed of a silicon oxide layer or a silicon nitride layer using a high density plasma chemical vapor deposition (HDP-CVD) process.

The lower pads 230 may be disposed on a bottom surface of the second semiconductor chip 210 and may be formed of a conductive material. The lower pads 230 may penetrate the passivation layer 220 to be electrically and/or physically connected to the connection members 240. Under bump metal (UBM) patterns may be disposed on the lower pads 230. In an exemplary embodiment, the lower pads 230 may be formed of an aluminum material or a copper material using a pulse plating process or a direct current (DC) plating process.

The connection members 240 may be formed to contact the lower pads 230. The connection members 240 may be formed of a conductive material. For example, the connection members 240 may be formed of a copper (Cu) material, an aluminum (Al) material, a silver (Ag) material, a tin (Sn) material, a gold (Au) material or a solder material. The connection members 240 may be formed of a single-layered material or a multi-layered material. The connection members 240 may be formed of a multi-layered material, and each of the connection members 240 may be formed to include a copper pillar and a solder material. The connection members 240 may be formed of a single-layered material, and each of the connection members 240 may be formed to include a tin-silver solder material or a copper material.

The semiconductor package 1100 according to the above embodiment may correspond to a multi-chip package (MCP) in which a plurality of semiconductor chips (e.g., the first and second semiconductor chips 110 and 210) are sequentially stacked or a system in package (SIP) in which a logic semiconductor chip and a memory semiconductor chip are disposed. The semiconductor package 1100 may include the first semiconductor chip 110 and the first through electrodes 150 penetrating the first semiconductor chip 110, and the first through electrodes 150 may be formed of a conductive material. The semiconductor package 1100 may be damaged by external static electricity or external electromagnetic wave signals, and the semiconductor package 1100 may include the antistatic layer 500 which is disposed on the molding member 400 to shield the first and second semiconductor chips 110 and 210 from the external static electricity or the external electromagnetic wave signals, like the semiconductor package 1000 illustrated in FIG. 2. The semiconductor package 1100 may include the ground patterns 300 disposed on edges of the top surface of the substrate 10, and outer sidewall surfaces of the ground patterns 300 may contact the inner sidewall surfaces of the antistatic layer 500. The antistatic layer 500 may be grounded to effectively shield the first and second semiconductor chips 110 and 210 from the external static electricity and the external electromagnetic wave signals.

Figure 5:
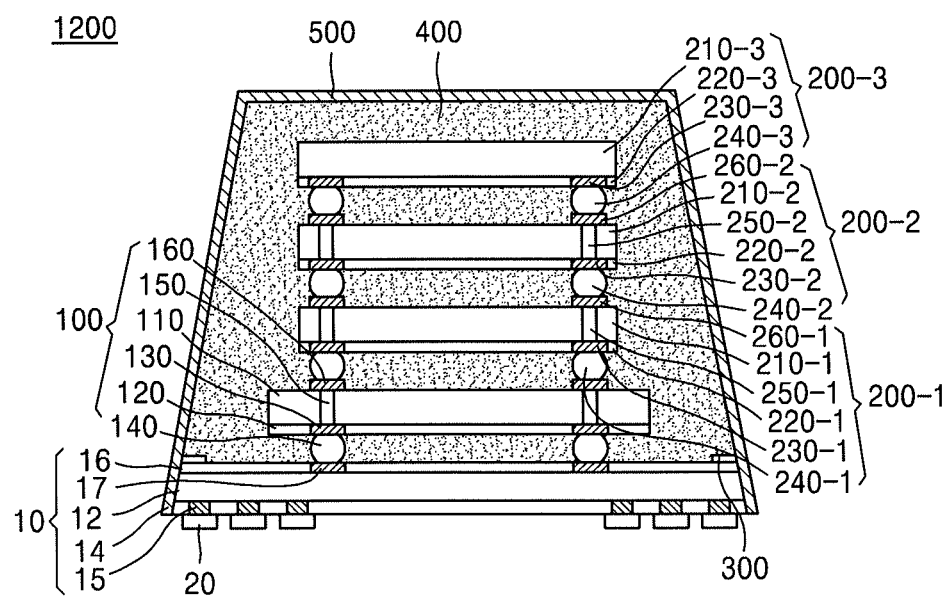

FIG. 5 illustrates a cross-sectional view of a semiconductor package 1200 according to an embodiment. Referring to FIG. 5, the semiconductor package 1200 may include a substrate 10, external connection terminals 20 disposed on a bottom surface of the substrate 10, a first semiconductor device 100 mounted on a top surface of the substrate 10, ground patterns 300 disposed on edges of the top surface of the substrate 10, a molding member 400 disposed on the top surface of the substrate 10 to cover the first semiconductor device 100, and an antistatic layer 500 covering a top surface and sidewall surfaces of the molding member 400 and extending to contact sidewall surfaces of the substrate 10, like the semiconductor package 1100 illustrated in FIG. 4. As compared with the semiconductor package 1100 illustrated in FIG. 4, the semiconductor package 1200 may include a plurality of second semiconductor devices 200-1, 200-2, and 200-3 composed of a plurality of second semiconductor chips 210-1, 210-2, and 210-3, instead of the second semiconductor device 200 of FIG. 4. Second through electrodes 250-1 may be disposed to penetrate the second semiconductor chip 210-1, and second through electrodes 250-2 may be disposed to penetrate the second semiconductor chip 210-2. The substrate 10, the external connection terminals 20, the ground patterns 300, the molding member 400, and the antistatic layer 500 may have the same configurations as described with reference to FIG. 4. Descriptions of the substrate 10, the external connection terminals 20, the ground patterns 300, the molding member 400, and the antistatic layer 500 will be omitted in the present embodiment to avoid duplicate explanations.

As described above, the semiconductor package 1200 may include the plurality of second semiconductor chips 210-1, 210-2, and 210-3. The plurality of second semiconductor chips 210-1, 210-2, and 210-3 may be the same type of semiconductor chips or different types of semiconductor chips. In some embodiments, the plurality of second semiconductor chips 210-1, 210-2, and 210-3 may be the same type of semiconductor chips and may be vertically stacked on the substrate 10. For example, each of the plurality of second semiconductor chips 210-1, 210-2, and 210-3 may include at least one of a DRAM chip, an SRAM chip, a flash memory chip, an EEPROM chip, a PRAM chip, an MRAM chip, and an RRAM chip.

Although FIG. 5 illustrates an example in which the number of the second semiconductor chips 210-1, 210-2, and 210-3 are three. For example, in some embodiments, two, four or more second semiconductor chips may be stacked on the first semiconductor chip 100.

The second through electrodes 250-1 may penetrate the second semiconductor chip 210-1 to be connected to lower pads 230-1 disposed on a bottom surface of the second semiconductor chip 210-1, and the second through electrodes 250-2 may penetrate the second semiconductor chip 210-2 to be connected to lower pads 230-2 disposed on a bottom surface of the second semiconductor chip 210-2. In some embodiments, the second through electrodes 250-1 and 250-2 may be TSVs. In an embodiment, the second through electrodes 250-1 and 250-2 may be disposed in a pin grid array (PGA) form, a ball grid array (BGA) form, or a micro pillar grid array (MPGA) form.

Each of the second through electrodes 250-1 and 250-2 may include, for example, a barrier metal layer and an interconnection metal layer. The barrier metal layer may have a single layered structure including, for example, any one of a titanium (Ti) material, a tantalum (Ta) material, a titanium nitride (TiN) material, and a tantalum nitride (TaN) material. In an embodiment, the barrier metal layer may have a multi-layered structure including, for example, at least two of a titanium (Ti) material, a tantalum (Ta) material, a titanium nitride (TiN) material, and a tantalum nitride (TaN) material. The interconnection metal layer may include, for example, at least one of an aluminum (Al) material, a gold (Au) material, a beryllium (Be) material, a bismuth (Bi) material, a cobalt (Co) material, a copper (Cu) material, a hafnium (Hf) material, an indium (In) material, a manganese (Mn) material, a molybdenum (Mo) material, a nickel (Ni) material, a lead (Pb) material, a palladium (Pd) material, a platinum (Pt) material, a rhodium (Rh) material, a rhenium (Re) material, a ruthenium (Ru) material, a tantalum (Ta) material, a tellurium (Te) material, a titanium (Ti) material, a tungsten (W) material, a zinc (Zn) material, and a zirconium (Zr) material. For example, the interconnection metal layer may have a single layered structure including, for example, any one of a tungsten (W) material, an aluminum (Al) material, and a copper (Cu) material. In an embodiment, the interconnection metal layer may have a multi-layered structure including, for example, at least two of a tungsten (W) material, an aluminum (Al) material, and a copper (Cu) material.

The second semiconductor chips 210-1, 210-2, and 210-3 may be electrically and/or physically connected to each other through the second through electrodes 250-1 and 250-2. The second through electrodes 250-1 may electrically and/or physically connect upper pads 260-1 disposed on a top surface of the second semiconductor chip 210-1 to connection members 240-1 disposed between the first semiconductor chip 110 and the second semiconductor chip 210-1, and the second through electrodes 250-2 may electrically and/or physically connect upper pads 260-2 disposed on a top surface of the second semiconductor chip 210-2 to connection members 240-2 disposed between the second semiconductor chip 210-1 and the second semiconductor chip 210-2. The second through electrodes 250-1 and 250-2 may electrically and/or physically connect the second semiconductor chips 210-1, 210-2, and 210-3 to each other. The second semiconductor chip 210-1 corresponding to a lowermost chip among the second semiconductor chips 210-1, 210-2, and 210-3 may be connected to the first semiconductor chip 110 through the connection members 240-1 and the upper pads 160. The connection members 240-1, 240-2, and 240-3 may be, for example, solder balls.

Figure 6:
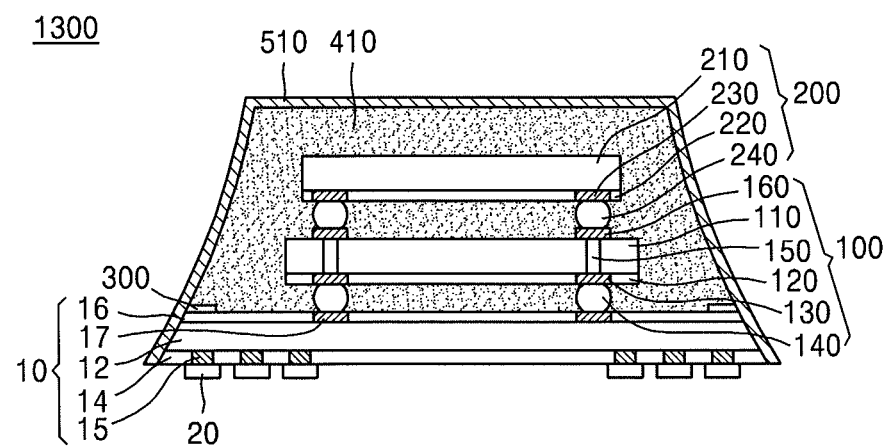
Figure 7:
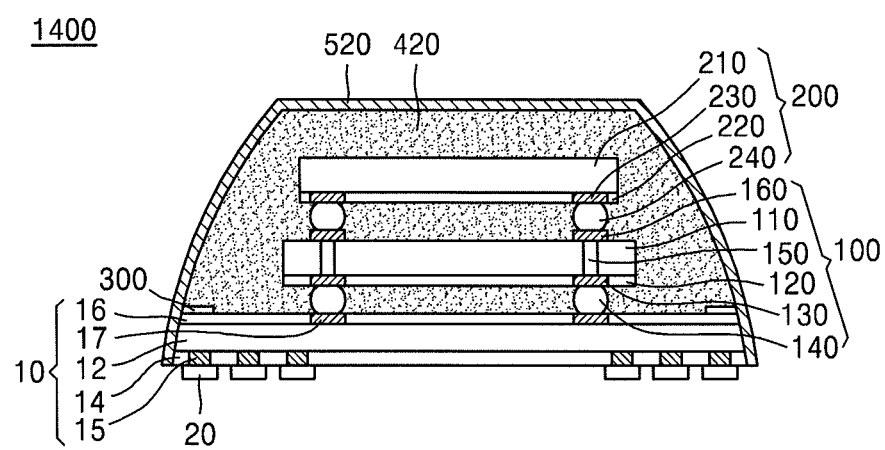

FIGS. 6 and 7 illustrate cross-sectional views of semiconductor packages 1300 and 1400 according to some embodiments. Referring to FIGS. 6 and 7, each of the semiconductor packages 1300 and 1400 may include a substrate 10, external connection terminals 20 disposed on a bottom surface of the substrate 10, a first semiconductor device 100 mounted on a top surface of the substrate 10, a second semiconductor device 200 stacked on the first semiconductor device 100, and ground patterns 300 disposed on edges of the top surface of the substrate 10. The semiconductor package 1300 may further include a molding member 410 disposed on the top surface of the substrate 10 to cover the first and second semiconductor devices 100 and 200 and an antistatic layer 510 covering a top surface and sidewall surfaces of the molding member 410 and extending to contact sidewall surfaces of the substrate 10, and the semiconductor package 1400 may further include a molding member 420 disposed on the top surface of the substrate 10 to cover the first and second semiconductor devices 100 and 200 and an antistatic layer 520 covering a top surface and sidewall surfaces of the molding member 420 and extending to contact sidewall surfaces of the substrate 10.

The sidewall surfaces of the molding members 410 and 420 and the antistatic layers 510 and 520 may have a curved shape, unlike the molding members 400 and the antistatic layers 500 of the semiconductor packages 1000, 1100 and 1200 illustrated in FIGS. 2, 4 and 5. Each of the sidewall surfaces of the molding member 410 of the semiconductor package 1300 may have a concave shape, as illustrated in FIG. 6. Each of the sidewalls of the antistatic layer 510 covering the molding member 410 may directly contact the corresponding sidewall surface of the molding member 410 to have a concave shape, as illustrated in FIG. 6. In an embodiment, each of the sidewall surfaces of the molding member 420 of the semiconductor package 1400 may have a convex shape, as illustrated in FIG. 7. Each of the sidewalls of the antistatic layer 520 covering the molding member 420 may directly contact the corresponding sidewall surface of the molding member 420 to have a convex shape, as illustrated in FIG. 7.

The curved shapes of the sidewall surfaces of the molding members 410 and 420 of the semiconductor packages 1300 and 1400 may be determined according to a shape of a blade (610 of FIGS. 10 and 11) used in a cutting process (i.e., a die sawing process) for separating a plurality of semiconductor chips formed on a wafer from each other or according to variation of the cutting process. The antistatic layers 510 and 520 may be formed by spraying a metal epoxy material on the molding members 410 and 420. The shapes of the antistatic layers 510 and 520 may be consistent with surface profiles of the molding members 410 and 420. The antistatic layers 510 and 520 of the semiconductor packages 1300 and 1400 may be connected to the ground patterns 300 disposed on edges of the top surface of the substrate 10, like the antistatic layer 500 of the semiconductor package 1000 illustrated in FIG. 2. The antistatic layers 510 and 520 may be grounded to shield the first and second semiconductor devices 100 and 200 from the external static electricity and the external electromagnetic wave signals.

Figure 8:
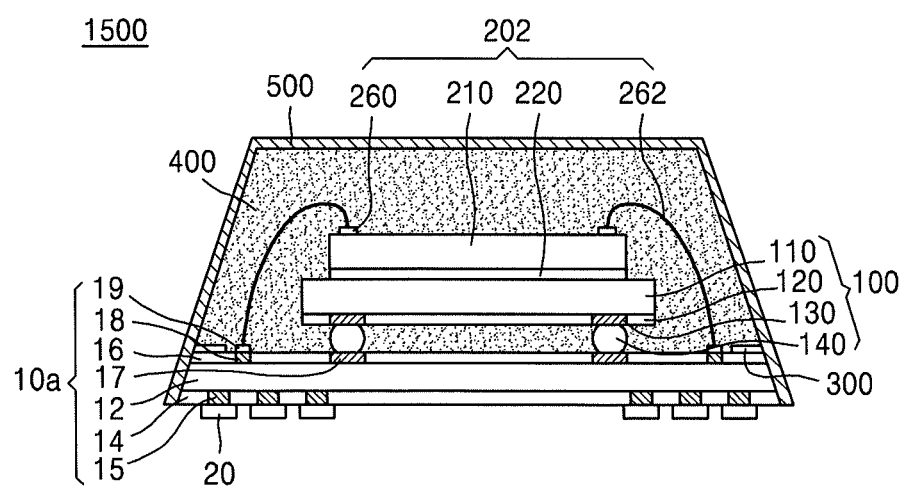

FIG. 8 illustrates a cross-sectional view of a semiconductor package 1500 according to an embodiment. Referring to FIG. 8, the semiconductor package 1500 may include a substrate 10, external connection terminals 20 disposed on a bottom surface of the substrate 10, a first semiconductor device 100 mounted on a top surface of the substrate 10, ground patterns 300 disposed on edges of the top surface of the substrate 10, a molding member 400 disposed on the top surface of the substrate 10 to cover the first semiconductor device 100, and an antistatic layer 500 covering a top surface and sidewall surfaces of the molding member 400 and extending to contact sidewall surfaces of the substrate 10, like the semiconductor package 1100 illustrated in FIG. 4. As compared with the semiconductor package 1100 illustrated in FIG. 4, the semiconductor package 1500 may include a second semiconductor device 202 instead of the second semiconductor device 200 of FIG. 4 and may further include upper interconnection patterns 18, upper connection terminals 19, and bonding wires 262. The second semiconductor device 200 may be electrically connected to the substrate 10 through the bonding wires 262. The external connection terminals 20, the ground patterns 300, the molding member 400, and the antistatic layer 500 may have the same configurations as described with reference to FIG. 2.

Descriptions of the external connection terminals 20, the ground patterns 300, the molding member 400, and the antistatic layer 500 will be omitted in the present embodiment to avoid duplicate explanations.

The substrate 10a may be a support substrate on which the first semiconductor device 100 is mounted and may include a body layer 12, a lower protection layer 14, lower pads 15, an upper protection layer 16, upper pads 17, the upper interconnection patterns 18, and the upper connection terminals 19. The substrate 10a may include at least one of a ceramic substrate, a PCB, an organic substrate, and an interposer substrate. In an embodiment, the substrate 10a may be an active wafer. Interconnection patterns formed of a single-layered material or a multi-layered material may be disposed in the body layer 12, and the interconnection patterns may electrically and/or physically connect the lower pads 15 to the upper pads 17. The lower protection layer 14 may protect the body layer 12 and may include an insulation material such as a solder resist material.

The lower pads 15 may be disposed on a bottom surface of the body layer 12 and may penetrate the lower protection layer 14 to be electrically and/or physically connected to the interconnection patterns in the body layer 12. The upper pads 17 may be disposed on a top surface of the body layer 12 and may be electrically and/or physically connected to the first semiconductor chip 110 through the connection member 140 of the first semiconductor device 100. The upper interconnection patterns 18 may be disposed to penetrate edges of the upper protection layer 16. The upper interconnection patterns 18 may be electrically and/or physically connected to the upper connection terminals 19 disposed on the edges of the upper protection layer 16.

The second semiconductor device 202 may include a second semiconductor chip 210, a passivation layer 220, upper pads 260, and bonding wires 262. The second semiconductor chip 210 may be a different type of semiconductor chip from the first semiconductor chip 110. In some embodiments, the first semiconductor chip 110 may be a logic semiconductor chip and the second semiconductor chip 210 may be a memory semiconductor chip. The upper pads 260 may be disposed on edges of a top surface of the second semiconductor chip 210, and the bonding wires 262 may connect the upper pads 260 to the upper connection terminals 19 of the substrate 10. The bonding wires 262 may be formed to include a conductive material such as a copper material, an iron material, or a stainless material. The second semiconductor chip 210 may be electrically and/or physically connected to the substrate 10 through the upper pads 260 and the bonding wires 262.

The molding member 400 may be disposed on the top surface of the substrate 10 to cover the first and second semiconductor devices 100 and 202, top surfaces and inner sidewall surfaces of the ground patterns 300, the upper connection terminals 19, the upper pads 260, and the bonding wires 262. A top surface and sidewall surfaces of the molding member 400 may be covered with the antistatic layer 500. The shape, material, formation method and EMI shielding effect of the molding member 400 and the antistatic layer 500 of the semiconductor package 1500 may be the same as those described with reference to FIG. 2.

Figure 9:
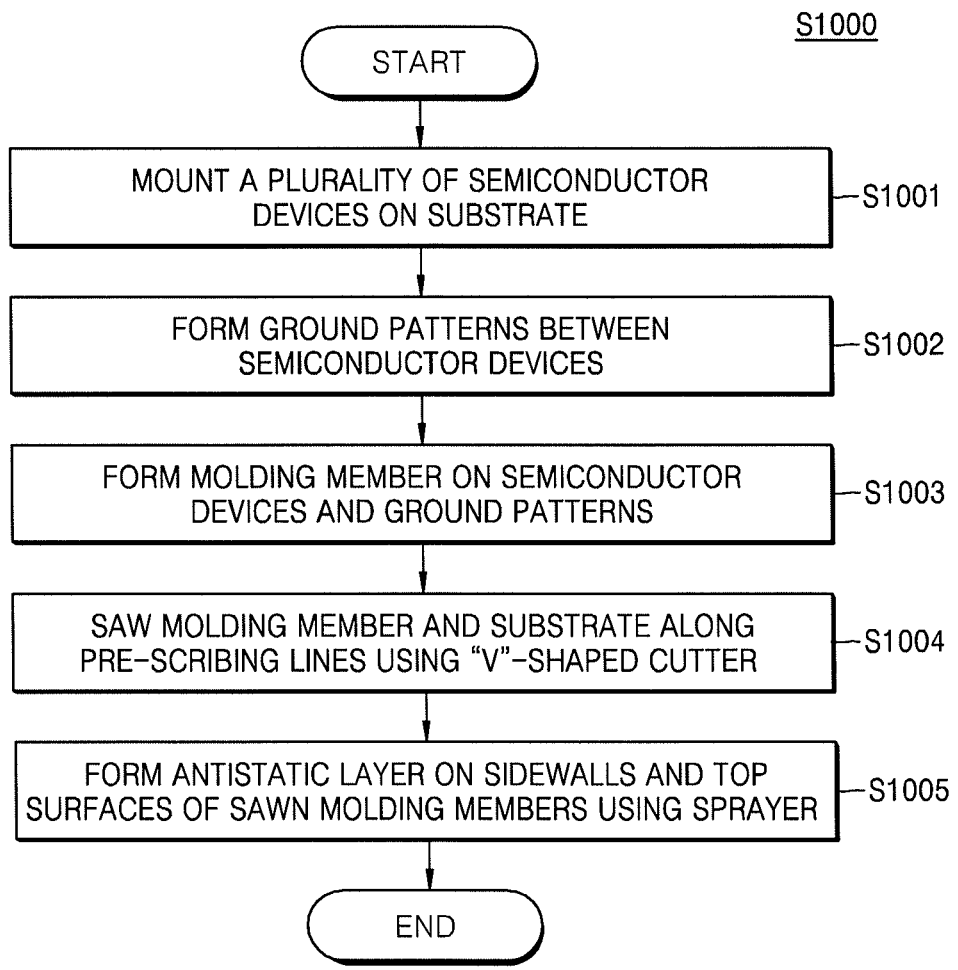
FIG. 9 illustrates a flowchart of a method of fabricating a semiconductor package according to an embodiment.

FIG. 9 is a flowchart of a method S1000 of fabricating any one of the semiconductor packages 1000, 1100, 1200, 1300, 1400, and 1500 according to some embodiments. Referring to FIG. 9, the method S1000 of fabricating the semiconductor package 1000, 1100, 1200, 1300, 1400, or 1500 may include an operation S1001 of mounting a plurality of semiconductor devices on a substrate, an operation S1002 of forming ground patterns on the substrate in regions between the semiconductor devices, an operation S1003 of forming a molding member that covers the semiconductor devices and the ground patterns, an operation S1004 of sawing the molding member and the substrate along pre-scribing lines using a "V"-shaped cutter, and an operation S1005 of forming an antistatic layer on sidewalls and top surfaces of the sawn molding members using a sprayer.

The operation S1001 of mounting the plurality of semiconductor devices on the substrate and the operation S1002 of forming the ground patterns on the substrate in regions between the semiconductor devices are illustrated in and will be described more fully with reference to FIG. 10. The operation S1003 of forming the molding member on the semiconductor devices and the ground patterns is illustrated in and will be described more fully with reference to FIG. 11. The operation S1004 of sawing the molding member and the substrate along pre-scribing lines using the "V"-shaped cutter is illustrated in and will be described more fully with reference to FIGS. 11, 12, and 13. The operation S1005 of forming the antistatic layer on sidewalls and top surfaces of the sawn molding members using the sprayer is illustrated in and will be described more fully with reference to FIG. 14.

Figure 10:
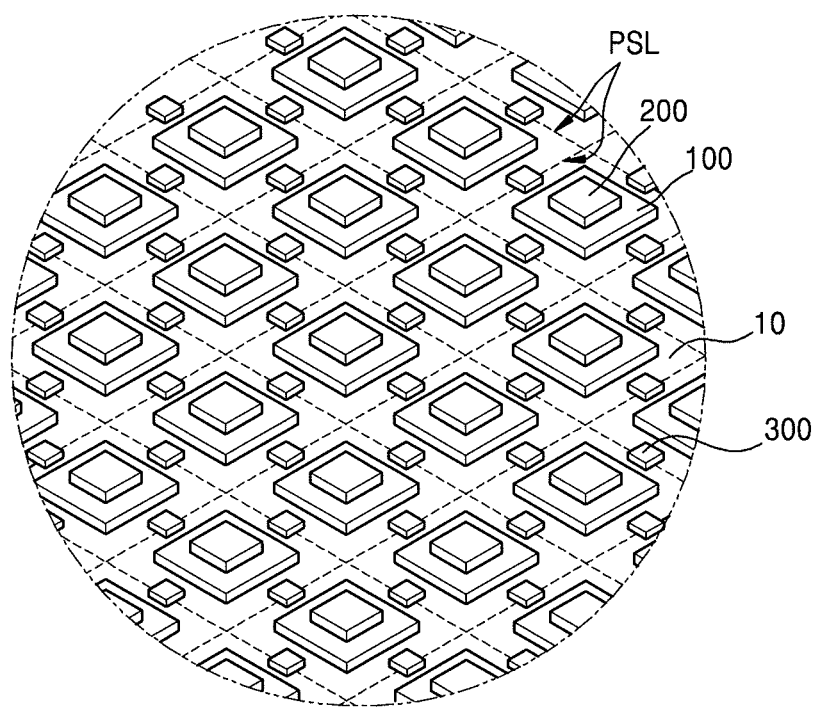
FIGS. 10 and 11 illustrate schematic views of a method of fabricating a semiconductor package according to an embodiment.

FIGS. 10 to 14 illustrate schematic views of methods of fabricating the semiconductor packages 1000, 1100, 1200, 1300, 1400, and 1500 according to some embodiments. Referring to FIG. 10, the semiconductor packages 1000, 1100, 1200, 1300, 1400, or 1500 may be fabricated by forming a plurality of ground patterns 300 on the substrate 10 by stacking a plurality of first semiconductor devices 100 on the substrate 10, and by stacking a plurality of second semiconductor devices 200 on the plurality of first semiconductor devices 100. The method of fabricating any one of the semiconductor packages 1000, 1200, 1300, 1400, and 1500 may be performed at a wafer level, which means that semiconductor chips are directly mounted on a wafer or a trimming process or a grinding process is performed at a wafer level. Performing the fabrication processes at a wafer level may include cutting the wafer into a plurality of individual base chips or a plurality of individual chips and redistributing the individual base chips or the individual chips on a supporting substrate having a wafer size appropriate to perform the fabrication processes. Although the semiconductor package 1000 illustrated in FIG. 2 does not include the second semiconductor device 200, FIGS. 9 to 13 illustrate the first and second semiconductor devices 100 and 200 for the purpose of ease and convenience of explanation of the fabrication method of the semiconductor packages 1000, 1100, 1200, 1300, 1400, or 1500.

The substrate 10 may be a single crystalline silicon wafer, an epitaxial wafer, a polished wafer, an annealed wafer or a silicon-on-insulator (SOI) wafer, as described with reference to FIG. 2.

The plurality of first semiconductor devices 100 may be mounted on the substrate 10, and the plurality of second semiconductor devices 200 may be stacked on respective ones of the plurality of first semiconductor devices 100. The plurality of ground patterns 300 may be formed on the substrate 10 between the plurality of first semiconductor devices 100. Each of the ground patterns 300 may be divided into two portions by one of a plurality of pre-scribing lines (PSLs) which are imaginarily arrayed on the substrate along rows and columns to define a plurality of package regions.

Figure 11:
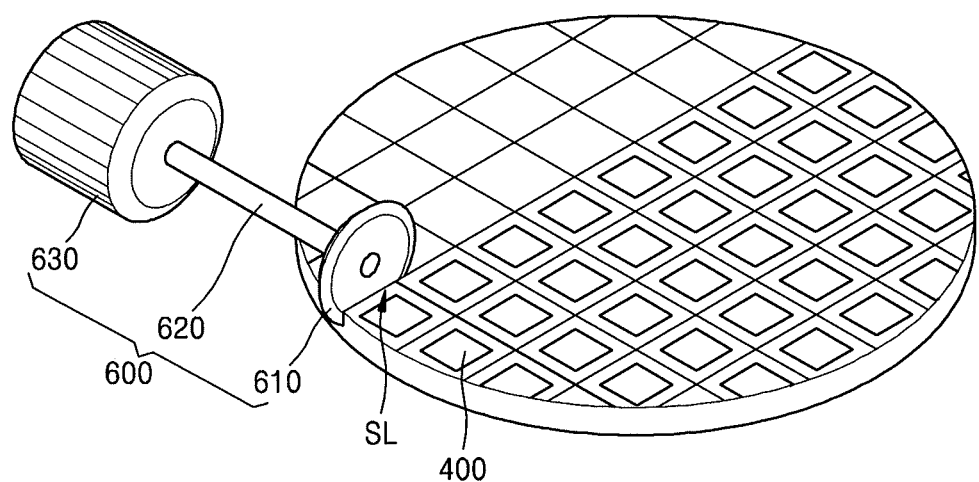

Referring to FIG. 11, a molding member 400 may be formed on the substrate 10 to cover the plurality of first semiconductor devices 100, the plurality of second semiconductor devices 200, and the plurality of ground patterns 300. The molding member 400 and the substrate 10 may be sawn along the pre-scribing lines (PSLs) using a blade 600 to form a plurality of separate semiconductor packages.

The molding member 400 may be formed of an epoxy-type material, a thermosetting material, a thermoplastic material or an ultraviolet (UV) treatment material. The molding member 400 may be formed to include a thermosetting material, and a hardening agent and an additive agent may be added into the molding member 400. The hardening agent may include a phenol-type hardening agent, an acid anhydride-type hardening agent or an amine-type hardening agent, and the additive agent may include an acrylic polymer-type additive agent. In some embodiments, the molding member 400 may be formed to include an epoxy type material using a molded underfill (MUF) technique. The molding member 400 may be formed to sufficiently cover top surfaces of the plurality of second semiconductor devices 200.

After the molding member 400 is formed, the molding member 400, the ground patterns 300 and the substrate 10 may be sawn along the pre-scribing lines (PSLs) using the blade 600. FIG. 11 illustrates an example in which the molding member 400, the ground patterns 300, and the substrate 10 are sawn using the blade 600. The molding member 400, the ground patterns 300, and the substrate 10 may be sawn using any one of sawing machines which are capable of providing a groove having a "V"-shaped cross section CS (see FIG. 12). For example, the molding member 400, the ground patterns 300, and the substrate 10 may be sawn using a mechanical sawing machine, such as a water-jet sawing machine, an aerosol-jet sawing machine, and the like.

The blade 600 may include a blade wheel 610, a rotating axis 620 and a supporting bar 630. The blade wheel 610 may include an edge having a "V"-shaped cross section. The molding member 400, the ground patterns 300, and the substrate 10 may be sawn by rotating the blade wheel 610 connected to the rotating axis 620 supported by the supporting bar 630.

Figure 12:
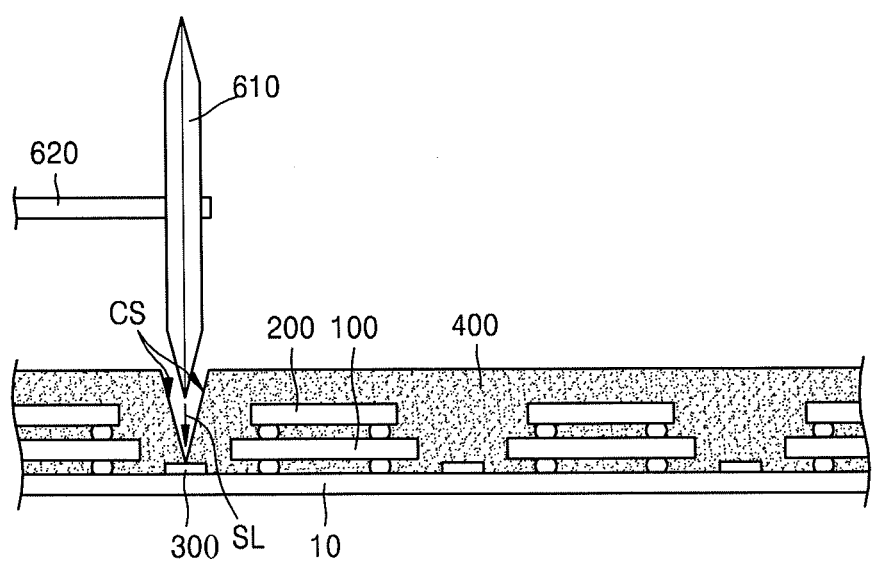
FIGS. 12, 13, and 14 illustrate cross-sectional views of a method of fabricating a semiconductor package according to an embodiment.

Referring to FIG. 12, the cross section CS of the groove formed by sawing the molding member 400 along the scribing line SL may exhibit a "V"-shaped configuration. For example, the molding member 400 may be sawn by the blade wheel 610 including an edge having a "V"-shaped cross section. According to variations in the sawing process, the "V"-shaped groove formed by sawing the molding member 400 may have curved sidewalls, for example, convex sidewalls or concave sidewalls.

Figure 13:
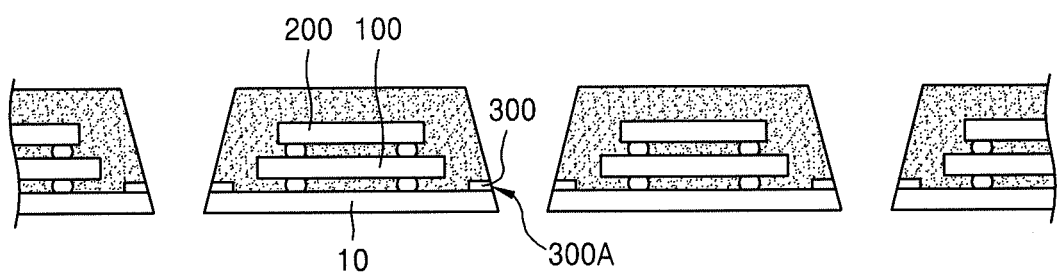

Referring to FIG. 13, the blade wheel (610 of FIG. 12) may saw the ground patterns 300 and the substrate 10 along the scribing line (SL of FIG. 12) to form the grooves having a "V"-shaped cross section and to provide a plurality of separate semiconductor packages. Each of the separate semiconductor packages may be provided to include one of the first semiconductor devices 100 and one of the second semiconductor devices 200. Following the sawing process, first sidewall surfaces 300A (see FIG. 3) of the sawn ground patterns 300 may be exposed and sidewall surfaces of the sawn substrates 10 may have a sloped profile.

Figure 14:
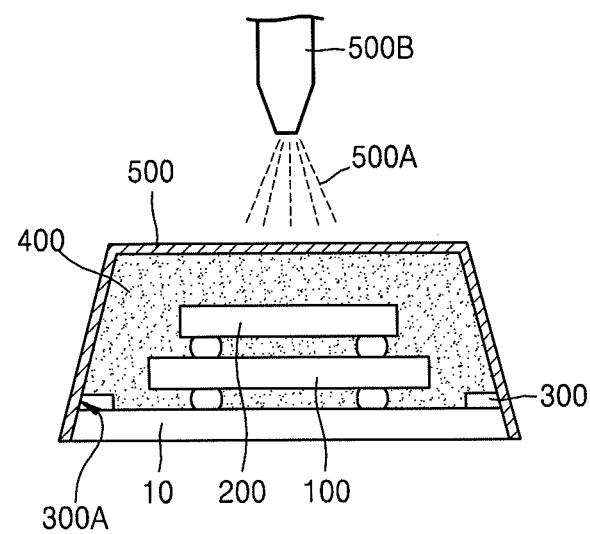

Referring to FIG. 14, an antistatic layer 500 may be formed to cover sidewall surfaces of the sawn substrate 10, the first sidewall surfaces 300A of the sawn ground patterns 300, and a top surface and sidewall surfaces of the sawn molding member 400. As described with reference to FIG. 2, the antistatic layer 500 may be formed of a metallic epoxy material that includes a metallic material having an electrostatic discharge (ESD) function and an epoxy resin material.

In some embodiments, the antistatic layer 500 may be formed of a mixture of a copper material and an epoxy resin material. In an embodiment, the antistatic layer 500 may be formed of a mixture of an alloy of copper and nickel and an epoxy resin material.

In some embodiments, the antistatic layer 500 may be formed by spraying a metallic epoxy material 500A on the sawn molding member 400 using a sprayer 500B. The antistatic layer 500 may be formed to simultaneously cover all of a top surface and sidewall surfaces of the sawn molding member 400 by spraying the metallic epoxy material 500A on the sawn molding member 400 only once using the sprayer 500B, for example, because each of the sidewall surfaces of the sawn molding member 400 has a positively inclined profile.

The sawn molding member 400 may be formed such that a planar area of a top surface of the sawn molding member 400 is less than a planar area of a bottom surface of the sawn molding member 400 and sidewall surfaces of the sawn molding member 400 have a positive sloped profile. The metallic epoxy material 500A may be supplied onto the sawn molding member 400 with the sprayer 500B, and the antistatic layer 500 may be formed to have a uniform thickness. The metallic epoxy material 500A may be non-uniformly supplied according to variation of the spray process, and the antistatic layer 500 may be formed to have a non-uniform thickness. In some embodiments, the antistatic layer 500 may be formed such that a thickness of the antistatic layer 500 on the sloped sidewall surfaces of the sawn molding member 400 may be greater than a thickness of the antistatic layer 500 on the top surface of the sawn molding member 400.

According to the methods of fabricating the semiconductor packages described above, the molding member 400 and the substrate 10 may be sawn using the blade wheel 610 including an edge having a "V"-shaped cross section, thereby forming a groove having a "V"-shaped cross section in the molding member 400. The sawn molding member 400 may be formed such that a planar area of the top surface of the sawn molding member 400 is less than a planar area of the bottom surface of the sawn molding member 400 and the sidewall surfaces of the sawn molding member 400 have a positive sloped profile, and the antistatic layer 500 may be formed by spraying a metallic epoxy material 500A on the sawn molding member 400 using a sprayer 500B. Should the molding member 400 and the substrate 10 are sawn using a general blade wheel, the sidewall surfaces of the sawn molding member 400 may be formed to have a vertical profile, and the antistatic layer 500 may be insufficiently formed on the sidewall surfaces of the sawn molding member 400, and an ESD failure or an EMI phenomenon of the semiconductor package may be caused.

According to embodiments, the sidewall surfaces of the sawn molding member 400 are formed to have a positive sloped profile, as described above, the antistatic layer 500 may be uniformly formed on the top surface and the sidewall surfaces of the sawn molding member 400, and the antistatic layer 500 may successfully shield the first and second semiconductor devices 100 and 200 to sufficiently suppress an EMI phenomenon. According to the methods of fabricating the semiconductor packages described above, the antistatic layer 500 may be uniformly and simultaneously formed on the top surface and the sloped sidewall surfaces of the sawn molding member 400 by spraying the metallic epoxy material 500A on the sawn molding member 400 using the sprayer 500B. No additional process, such as a drawing process employing a dispenser, may be required to obtain a uniform antistatic layer, and the fabrication process of the semiconductor packages may be simplified.

As described with reference to FIGS. 2 and 3, each of the semiconductor packages 1100, 1200, 1300, 1400, and 1500 may be fabricated to include the ground patterns 300 disposed on edges of the top surface of the substrate 10, outer sidewall surfaces of the ground patterns 300 may contact the inner sidewall surfaces of the antistatic layer 500, and the antistatic layer 500 may be grounded to effectively shield the first and second semiconductor devices 100 and 200 from the external static electricity and the external electromagnetic wave signals.

Figure 15:
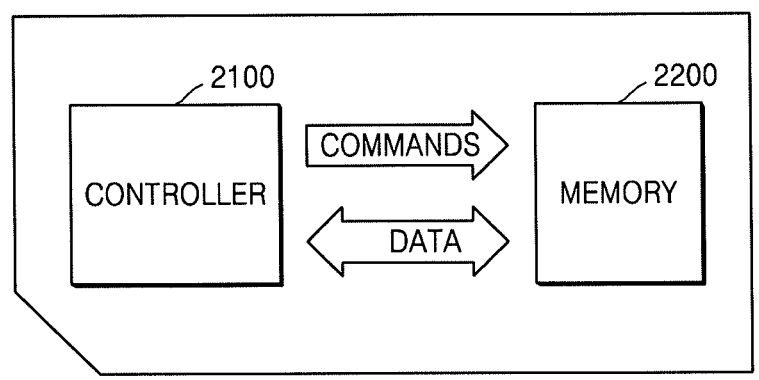
FIG. 15 illustrates a block diagram of a memory card including a semiconductor package according to an embodiment.

FIG. 15 illustrates a block diagram of a memory card 2000 including at least one of the semiconductor packages 1000, 1100, 1200, 1300, 1400, and 1500 according to some embodiments. Referring to FIG. 15, the memory card 2000 may include a controller 2100 and a memory 2200 that exchange electrical signals. For example, the controller 2100 may output commands to the memory 2200, and the memory 2200 may output data to the controller 2100 in response to the commands. The controller 2100 and/or the memory 2200 may include at least one of the semiconductor packages 1000, 1100, 1200, 1300, 1400, and 1500 according to embodiments. For example, the controller 2100 may include the first semiconductor device 100 employed in the semiconductor package 1000, 1100, 1200, 1300, 1400, or 1500 according to embodiments, and the memory 2200 may include the second semiconductor device 200 or 202 employed in the semiconductor package 1000, 1100, 1200, 1300, 1400, or 1500 according to embodiments.

The memory card 2000 may be used in various cards, for example, memory stick cards, smart media (SM) cards, secure digital (SD) cards, mini secure digital (SD) cards, multi media cards (MMC) or the like.

Figure 16:
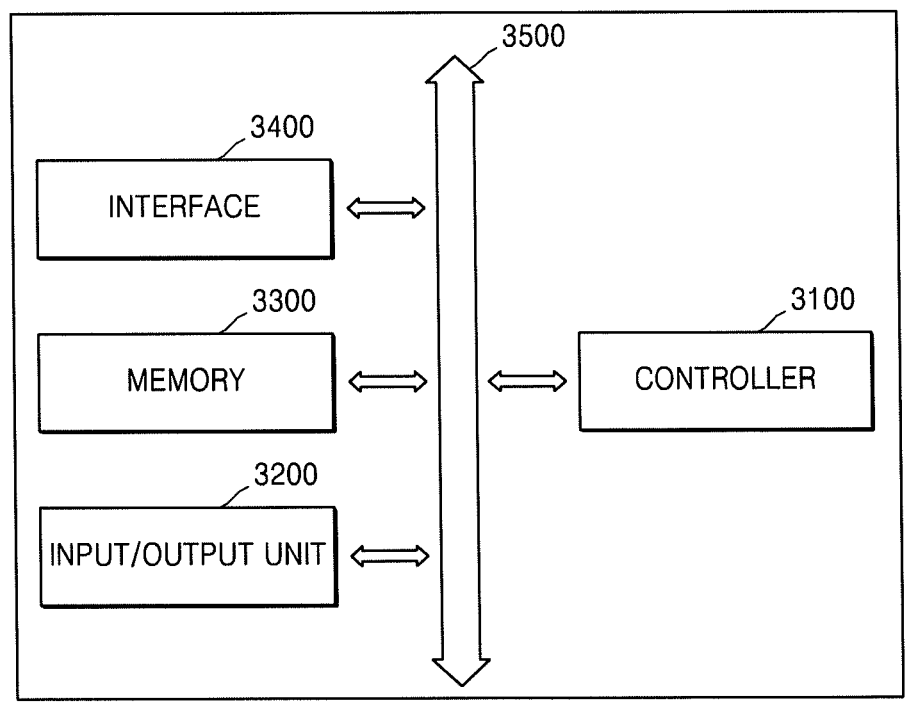
FIG. 16 illustrates a block diagram of an electronic system including a semiconductor package according to an embodiment.

FIG. 16 illustrates a block diagram of an electronic system 3000 including at least one of the semiconductor packages 1000, 1100, 1200, 1300, 1400, and 1500 according to some embodiments. Referring to FIG. 16, the electronic system 3000 may include a controller 3100, an input/output (I/O) unit 3200, a memory 3300, and an interface 3400. The electronic system 3000 may be a mobile system that receives and/or outputs information data. The mobile system may include a personal digital assistant (PDA), a portable computer, a web tablet, a wireless phone, a mobile phone, a digital music player and a memory card.

The controller 3100 may execute programs and may control overall operations of the electronic system 3000. The controller 3100 may be, for example, a microprocessor, a digital signal processor (DSP), a micro-controller, or the like. The I/O unit 3200 may be used to input data into the electronic system 3000 or to output the data stored in the electronic system 3000.

The electronic system 3000 may be connected to an external device or an external system through the I/O unit 3200 to communicate with the external device or the external system. The I/O unit 3200 may be, for example, a keypad, a keyboard or a display unit. The memory 3300 may store codes and/or data for operations of the controller 3100 or may store data which are processed by the controller 3100. The controller 3100 and/or the memory 3300 may include at least one of the semiconductor packages 1000, 1100, 1200, 1300, 1400, and 1500 according to embodiments. For example, the controller 3100 may include the first semiconductor device 100 employed in the semiconductor package 1000, 1100, 1200, 1300, 1400, or 1500, and the memory 3300 may include the second semiconductor device 200 or 202 employed in the semiconductor package 1000, 1100, 1200, 1300, 1400, or 1500 according to embodiments. The interface 3400 may provide a data transmission path between the electronic system 3000 and an external device or an external system. The controller 3100, the I/O unit 3200, the memory 3300, and the interface 3400 may communicate with each other through a bus 3500.

The electronic system 3000 may be applied to a mobile phone, an MP3 player, a navigation system, a portable multimedia player (PMP), a solid state drive (SSD) or a household appliance.

Figure 17:
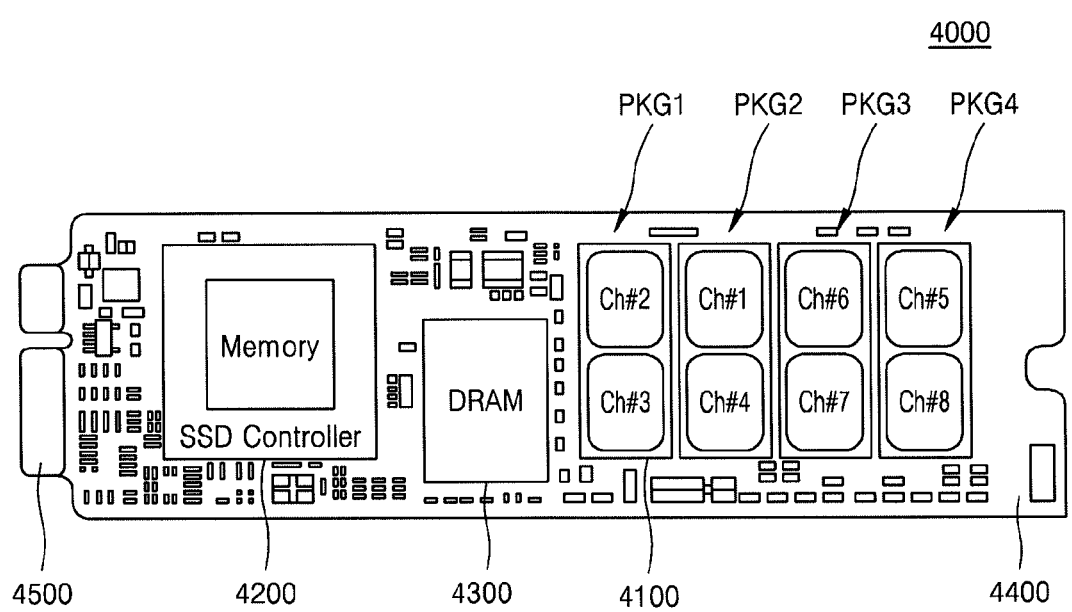
FIG. 17 illustrates a plan view of a solid state drive (SSD) employing a semiconductor package according to an embodiment.

FIG. 17 illustrates a plan view of a SSD 4000 including at least one of the semiconductor packages 1000, 1100, 1200, 1300, 1400, and 1500 according to some embodiments. FIG. 17 illustrates an example in which the electronic system 3000 of FIG. 16 is applied to the SSD 4000. Referring to FIG. 17, the SSD 4000 may include a memory package module 4100, an SSD controller package 4200, a DRAM 4300, and a main board 4400.

At least one of the memory package module 4100, the SSD controller package 4200, and the DRAM 4300 may include at least one of the semiconductor packages according to embodiments. The memory package module 4100 may be mounted on the main board 4400 and may be electrically connected to the main board 4400 through external connection members (20 of FIG. 2). The memory package module 4100 may include, for example, first to fourth memory packages PKG1, PKG2, PKG3, and PKG4, as illustrated in FIG. 17. In an embodiment, the memory package module 4100 may include five or more semiconductor packages according to a channel support configuration of the SSD controller package 4200. Meanwhile, the memory package module 4100 may be designed to have a multi-channel configuration, and the number of the memory packages included in the memory package module 4100 may be less than four.

The memory package module 4100 mounted on the main board 4400 may be designed to have, for example, a ball grid array (BGA) package form. For example, the memory package module 4100 may be designed to have a pin grid array (PGA) form, a micro pillar grid array (MPGA) form, a tape carrier package (TCP) form, a chip-on-board (COB) form, a quad flat non-leaded (QFN) form, or a quad flat package (QFP) form.

The memory package module 4100 may include at least of the semiconductor packages 1000, 1100, 1200, 1300, 1400, and 1500 according to embodiments.

The SSD controller package 4200 may have eight channels, and each of the first to fourth memory packages PKG1, PKG2, PKG3, and PKG4 may have two channels. The eight channels of the SSD controller package 4200 may be connected to the corresponding channels of the first to fourth memory packages PKG1, PKG2, PKG3, and PKG4 one on one to control semiconductor chips in the memory package module 4100.

The SSD controller package 4200 may include a program that can communicate with an external device or an external system in a serial advanced technology attachment (SATA) standard form, a parallel advanced technology attachment (PATA) standard form, or a small computer system interface (SCSI) standard form. The SATA standard form may include all SATA type standard forms, for example, a SATA-1 standard form, a SATA-2 standard form, and an external SATA (e-SATA) standard form. The PATA standard form may include all integrated drive electronics (IDE) type standard forms, for example, an IDE standard form and an enhanced IDE (E-IDE) standard form.

The SSD controller package 4200 may execute an error check code (ECC) treatment or a flash translation layer (FTL) treatment. The SSD controller package 4200 may also be mounted on the main board 4400. The SSD controller package 4200 may be designed to have a BGA package form, a PGA form, an MPGA form, a TCP form, a COB form, a QFN form, or a QFP form.

The SSD controller package 4200 may include at least one of the semiconductor packages 1000, 1100, 1200, 1300, 1400, and 1500 according to embodiments.

The DRAM 4300 may correspond to an auxiliary memory device that functions as a buffer when data are transmitted between the SSD controller package 4200 and the memory package module 4100. This DRAM 4300 may also be mounted on the main board 4400. The DRAM 4300 may be designed to have a BGA package form, a PGA form, an MPGA form, a TCP form, a COB form, a QFN form, or a QFP form.

The main board 4400 may be a PCB, a flexible PCB, an organic substrate, a ceramic substrate, or a tape substrate. The main board 4400 may include a core board having a top surface and a bottom surface and a resin layer covering the top and bottom surfaces of the core board. The resin layer may be formed to have a multi-layered structure, and interconnection patterns including signal lines, ground lines and power supply lines may be disposed in the resin layer. Additional interconnection patterns may be disposed on the resin layer. In FIG. 17, fine patterns illustrated on the resin layer may correspond to the additional interconnection patterns or a plurality of passive elements. An interface 4500 may be disposed at a side of the main board 4400 to communicate with an external device.

Figure 18:
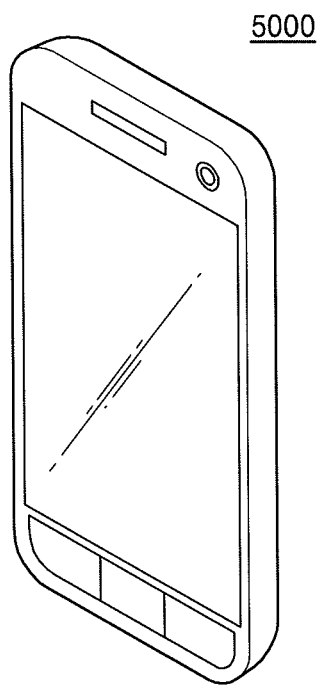
FIG. 18 illustrates an electronic device employing a semiconductor package according to an embodiment.

FIG. 18 illustrates a mobile phone 5000 including at least one of the semiconductor packages 1000, 1100, 1200, 1300, 1400, and 1500 according to some embodiments.

FIG. 18 illustrates an example in which the electronic system 3000 of FIG. 16 is applied to the mobile phone 5000. In an embodiment, the electronic system 3000 may be applied to portable notebook computers, MP3 players, navigation systems, SSDs, automobiles, or household appliances.

By way of summation and review, provided are semiconductor packages that may be capable of simplifying a formation process of an antistatic layer disposed on a molding member covering semiconductor devices and that may be capable of shielding the semiconductor devices from static electricity and electromagnetic wave signals. The molding member may be formed to include a top surface, a bottom surface having a planar area which is greater than a planar area of the top surface, and sidewall surfaces having a sloped profile.

Example embodiments have been disclosed herein, and although specific terms are employed, they are used and are to be interpreted in a generic and descriptive sense only and not for purpose of limitation. In some instances, as would be apparent to one of skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A method of fabricating a semiconductor package, the method comprising:
   providing a substrate;
   mounting a plurality of first semiconductor devices on the substrate;
   stacking a plurality of second semiconductor devices on the plurality of first semiconductor devices;
   forming a molding member that covers a top surface of the substrate, sidewall surfaces of the plurality of first semiconductor devices, and top surfaces and sidewall surfaces of plurality of second semiconductor devices;
   sawing the molding member and the substrate using a "V"-shaped cutter such that a planar area of a bottom surface of each of the sawn molding members is greater than a planar area of a top surface of each of the sawn molding members, a planar area of a bottom surface of each of the sawn substrates is greater than a planar area of a top surface of each of the sawn substrates, and sidewall surfaces of the sawn molding members and the sawn substrates have sloped profiles; and
   forming an antistatic layer that covers sidewall surfaces and a top surface of each of the sawn molding members and sidewalls of each of the sawn substrates.

2. The method as claimed in claim 1, wherein forming the antistatic layer includes spraying an antistatic material on the sidewalls surfaces and the top surface of each of the sawn molding member using a sprayer.

3. The method as claimed in claim 1, wherein mounting the plurality of first semiconductor devices on the substrate includes:
   forming first through electrodes penetrating the plurality of first semiconductor devices; and
   mounting the plurality of first semiconductor devices on the substrate to electrically connect the plurality of first semiconductor devices to the substrate via the first through electrodes.

4. The method as claimed in claim 3, wherein stacking the plurality of second semiconductor devices includes:
   forming second through electrodes penetrating the plurality of second semiconductor devices; and
   stacking the plurality of second semiconductor devices on the plurality of first semiconductor devices to electrically connect the second through electrodes to the first through electrodes.

5. The method as claimed in claim 1, further comprising forming a ground pattern on the substrate between each pair of adjacent first semiconductor devices.

6. The method as claimed in claim 5, wherein the plurality of ground patterns are formed of a conductive metal material.

7. The method as claimed in claim 5, wherein sawing the molding member and the substrate includes sawing the plurality of ground patterns to expose an entirety of a sidewall surface of each of the sawn ground patterns.

8. A method of fabricating a semiconductor package, the method comprising:
   mounting a plurality of semiconductor devices on a substrate;
   forming a molding member that covers a top surface of the substrate, top surfaces of the semiconductor devices, and sidewall surfaces of the semiconductor devices;
   dividing the semiconductor devices to form individual semiconductor devices such that a planar area of a bottom surface of each of individual semiconductor devices is greater than a planar area of a top surface of each of individual semiconductor devices; and
   forming an antistatic layer that covers sidewall surfaces and a top surface of each of the individual semiconductor devices,
   wherein entireties of sidewall surfaces of the individual semiconductor devices have sloped profiles, are convex, or are concave.

9. The method as claimed in claim 8, wherein entireties of sidewall surfaces of the individual semiconductor devices have sloped profiles.

10. The method as claimed in claim 8, wherein entireties of sidewall surfaces of the individual semiconductor devices are convex or concave.

11. The method as claimed in claim 8, wherein:
    dividing the semiconductor devices includes cutting the substrate into individual substrates corresponding to the individual semiconductor devices; and
    a planar area of a bottom surface of each of the individual substrates is greater than a planar area of a top surface of each of the individual substrates.

12. The method as claimed in claim 11, wherein the antistatic layer covers sidewalls of the individual substrates.

* * * * *